United States Patent
Ishizaki (10) Patent No.: US 9,922,040 B2
(45) Date of Patent: Mar. 20, 2018

(54) INFORMATION PROCESSING APPARATUS, INFORMATION PROCESSING METHOD AND PROGRAM

(71) Applicant: CANON KABUSHIKI KAISHA, Tokyo (JP)

(72) Inventor: Toru Ishizaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 633 days.

(21) Appl. No.: 14/561,603

(22) Filed: Dec. 5, 2014

(65) Prior Publication Data

US 2015/0161157 A1 Jun. 11, 2015

(30) Foreign Application Priority Data

Dec. 9, 2013 (JP) ................................. 2013-254338

(51) Int. Cl.
 *G06F 17/30* (2006.01)
 *H03M 7/30* (2006.01)

(52) U.S. Cl.
 CPC ........ *G06F 17/30153* (2013.01); *H03M 7/30* (2013.01); *H03M 7/607* (2013.01); *H03M 7/6064* (2013.01); *H03M 7/707* (2013.01)

(58) Field of Classification Search
 CPC ........... G06F 11/1453; G06F 17/00–17/30153; G06F 17/30156–17/30238;

(Continued)

(56) References Cited

U.S. PATENT DOCUMENTS

| 7,013,425 B2 * | 3/2006 | Kataoka | G06F 17/2247 715/242 |
| 8,149,148 B1 * | 4/2012 | Allen | H03M 7/707 341/106 |

(Continued)

FOREIGN PATENT DOCUMENTS

JP 2010-250434 A 11/2010

OTHER PUBLICATIONS

Query optimization in compressed database systems; Chen et al; Proceedings of the 2001 ACM SIGMOD international conference on Management of data; May 21-24, 2001; pp. 271-282 (12 pages) (Year: 2001).*

(Continued)

*Primary Examiner* — Daniel C Chappell
(74) *Attorney, Agent, or Firm* — Fitzpatrick, Cella, Harper & Scinto (57) ABSTRACT

The present invention aims to automatically determine an encoding parameter in consideration of a condition of compression efficiency and a memory usage and performing encoding based on the determined encoding parameter. To do so, an information processing method of an information processing apparatus comprises: estimating a memory usage concerning holding of a correspondence table of a part of structured data and codes; and estimating a compression effect obtained when the structured data is encoded, by holding the correspondence table, wherein a data size of the correspondence table is variable according to a value of a parameter, and the information processing method further comprises, under a condition of the memory usage, determining the value of the parameter on the basis of the estimated memory usage and the estimated compression effect, and encoding the structured data on the basis of the determined value of the parameter.

13 Claims, 11 Drawing Sheets

(58) Field of Classification Search
CPC ............. G06F 2211/00–2211/902; G06F 2216/00–2216/17; G06F 2212/00–2212/7211; H03M 7/00–7/6064; H03M 99/00
See application file for complete search history.

(56) References Cited

U.S. PATENT DOCUMENTS

| | | | | |
|---|---|---|---|---|
| 8,533,166 | B1* | 9/2013 | Sulieman | H04L 69/04 375/240 |
| 8,775,927 | B2* | 7/2014 | Dirstine | H03M 7/30 715/234 |
| 9,025,892 | B1* | 5/2015 | Lightner | H03M 7/30 382/232 |
| 9,098,558 | B2* | 8/2015 | Arshad | G06F 17/30569 |
| 2009/0019345 | A1* | 1/2009 | Kaufman | G06F 17/30312 714/807 |
| 2009/0083298 | A1 | 3/2009 | Ishizaki | 707/101 |
| 2009/0083315 | A1 | 3/2009 | Ishizaki et al. | 707/103 |
| 2009/0132569 | A1* | 5/2009 | Tamiya | G06F 17/2247 |
| 2009/0157712 | A1* | 6/2009 | De Peuter | H03M 7/30 |
| 2009/0271695 | A1* | 10/2009 | Ruellan | G06F 17/30911 715/227 |
| 2009/0287625 | A1* | 11/2009 | Fablet | G06F 17/2247 706/45 |
| 2010/0083101 | A1* | 4/2010 | Denoual | G06F 17/2258 715/242 |
| 2011/0153531 | A1 | 6/2011 | Ishizaki | 706/12 |
| 2012/0304051 | A1* | 11/2012 | Balakrishnan | G06F 17/217 715/239 |
| 2013/0024433 | A1* | 1/2013 | Amit | H03M 7/30 707/693 |
| 2014/0195497 | A1* | 7/2014 | Amit | G06F 17/30153 707/693 |
| 2014/0201175 | A1* | 7/2014 | Ohno | G06F 17/30153 707/693 |
| 2015/0178305 | A1* | 6/2015 | Mueller | G06F 17/30315 707/693 |
| 2015/0234852 | A1* | 8/2015 | Amit | G06F 17/30598 707/693 |
| 2015/0234899 | A1* | 8/2015 | Lightner | G06F 17/30501 707/693 |

OTHER PUBLICATIONS

Evaluation of models for parsing binary encoded XML-based metadata; De Sutter et al; Proceedings of 2004 International Symposium on Intelligent Signal Processing and Communication Systems; Nov. 18-19, 2004; pp. 419-424 (6 pages) (Year: 2004).*

Fast Transform for Effective XML Compression; Skibinski et al; 9th International Conference—The Experience of Designing and Applications of CAD Systems in Microelectronics; Feb. 19-24, 2007; pp. 323-326 (4 pages) (Year: 2007).*

* cited by examiner

ESTIMATION TABLE

NAME ESTIMATION TABLE

| STRUCTURE TYPE | CHARACTER STRING | COUNTER | MEMORY USAGE | COMPRESSION EFFECT | CORRESPONDING VALUE ESTIMATION TABLE |
|---|---|---|---|---|---|
| START ELEMENT | importRequest | 1 | 133 | 0 | |
| START ELEMENT | entry | 2 | 125 | 7 | |
| ATTRIBUTE | dn | 2 | 104 | 3 | 1 |
| START ELEMENT | attr | 6 | 124 | 30 | |
| ATTRIBUTE | name | 6 | 49 | 50 | 2 |
| START ELEMENT | value | 8 | 131 | 59 | 3 |

VALUE ESTIMATION TABLE #1

| CHARACTER STRING | COUNTER | MEMORY USAGE | COMPRESSION EFFECT |
|---|---|---|---|
| uuid=228461bf-7b0e-11d9-8000-00008533f2a7 | 1 | 41 | 0 |
| uuid=2259260a-7b0e-11d9-8000-00008533f2a7 | 1 | 41 | 0 |

VALUE ESTIMATION TABLE #2

| CHARACTER STRING | COUNTER | MEMORY USAGE | COMPRESSION EFFECT |
|---|---|---|---|
| objectclass | 2 | 11 | 11 |
| subdbid | 2 | 7 | 7 |
| indexId | 2 | 7 | 7 |

VALUE ESTIMATION TABLE #3

| CHARACTER STRING | COUNTER | MEMORY USAGE | COMPRESSION EFFECT |
|---|---|---|---|
| top | 2 | 3 | 3 |
| person | 2 | 6 | 6 |
| 1 | 2 | 1 | 1 |
| 945 | 1 | 3 | 0 |
| 946 | 1 | 3 | 0 |

FIG. 6

CALCULATION EXPRESSION OF MEMORY USAGE

CHARACTER STRING LENGTH + production SIZE * (A+E) + grammar SIZE * E

CALCULATION EXPRESSION OF COMPRESSION EFFECT (CHARACTER STRING LENGTH + A + E) * (COUNTER − 1)

A: ATTRIBUTE True(1), False(0)   E: ELEMENT True(1), False(0)

ESTIMATION TABLE

NAME ESTIMATION TABLE

| STRUCTURE TYPE | CHARACTER STRING | COUNTER | MEMORY USAGE | COMPRESSION EFFECT | CORRESPONDING VALUE ESTIMATION TABLE |
|---|---|---|---|---|---|
| START ELEMENT | importRequest | 1 | 133 | 0 | |
| START ELEMENT | entry | 2 | 125 | 7 | |
| ATTRIBUTE | dn | 2 | 104→22 | 3 | 1 |
| START ELEMENT | attr | 6 | 124 | 30 | |
| ATTRIBUTE | name | 6 | 49→21 | 50 | 2 |
| START ELEMENT | value | 8 | 131 | 59 | 3 |

REDUCTION
DELETION

VALUE ESTIMATION TABLE #1

| CHARACTER STRING | COUNTER | MEMORY USAGE | COMPRESSION EFFECT |
|---|---|---|---|
| uuid=228461bf-7b0e-11d9-8000-00008533f2a7 | 1 | 41 | 0 |
| uuid=2259260a-7b0e-11d9-8000-00008533f2a7 | 1 | 41 | 0 |

VALUE ESTIMATION TABLE #2

| CHARACTER STRING | COUNTER | MEMORY USAGE | COMPRESSION EFFECT |
|---|---|---|---|
| objectclass | 2 | 11 | 11 |
| subdbid | 2 | 7 | 7 |
| indexId | 2 | 7 | 7 |

VALUE ESTIMATION TABLE #3

| CHARACTER STRING | COUNTER | MEMORY USAGE | COMPRESSION EFFECT |
|---|---|---|---|
| top | 2 | 3 | 3 |
| person | 2 | 6 | 6 |
| 1 | 2 | 1 | 1 |
| 945 | 1 | 3 | 0 |
| 946 | 1 | 3 | 0 |

MEMORY USAGE 666 → 559 valueMaxLength 6 maxNumberOfNamePartition 6

ESTIMATION TABLE

NAME ESTIMATION TABLE

| STRUCTURE TYPE | CHARACTER STRING | COUNTER | MEMORY USAGE | COMPRESSION EFFECT | CORRESPONDING VALUE ESTIMATION TABLE | |
|---|---|---|---|---|---|---|
| START ELEMENT | importRequest | 1 | 133 | 0 | | ← DELETION |
| START ELEMENT | entry | 2 | 125 | 7 | | |
| ATTRIBUTE | dn | 2 | 104 | 3 | 1 | |
| START ELEMENT | attr | 6 | 124 | 30 | | |
| ATTRIBUTE | name | 6 | 49 | 50 | 2 | |
| START ELEMENT | value | 8 | 131 | 59 | 3 | |

VALUE ESTIMATION TABLE #1

| CHARACTER STRING | COUNTER | MEMORY USAGE | COMPRESSION EFFECT |
|---|---|---|---|
| uuid=228461bf-7b0e-11d9-8000-00008533f2a7 | 1 | 41 | 0 |
| uuid=2259260a-7b0e-11d9-8000-00008533f2a7 | 1 | 41 | 0 |

VALUE ESTIMATION TABLE #2

| CHARACTER STRING | COUNTER | MEMORY USAGE | COMPRESSION EFFECT |
|---|---|---|---|
| objectclass | 2 | 11 | 11 |
| subdbid | 2 | 7 | 7 |
| indexId | 2 | 7 | 7 |

VALUE ESTIMATION TABLE #3

| CHARACTER STRING | COUNTER | MEMORY USAGE | COMPRESSION EFFECT |
|---|---|---|---|
| top | 2 | 3 | 3 |
| person | 2 | 6 | 6 |
| 1 | 2 | 1 | 1 |
| 945 | 1 | 3 | 0 |
| 946 | 1 | 3 | 0 |

THRESHOLD OF COMPRESSION EFFECT  5
MEMORY USAGE  666 → 553
valueMaxLength  0
maxNumberOfNamePartition  0

FIG. 11

INFORMATION PROCESSING APPARATUS, INFORMATION PROCESSING METHOD AND PROGRAM

BACKGROUND OF THE INVENTION

Field of the Invention

The present invention relates to an information processing apparatus, an information processing method, a program for performing the information processing method, and a storage medium for storing the program.

Description of the Related Art

Conventionally, there is the technique called a binary XML (Extensible Markup Language) for achieving data size compression and high-speed analyzing process for an XML-document. In the binary XML, character strings which repetitively appear are replaced by short codes respectively, thereby achieving the data size compression and the high-speed analyzing process. For this reason, since a correspondence table which represents correspondence of the repetitively appeared character strings and the short codes is necessary, there is a problem that a large amount of memory is consumed in encoding and decoding processes. Consequently, in EXI (Efficient XML Interchange) which is a kind of the binary XML, it starts to work out a specification called EXI Profile, and enables parameter control which does not consume a certain level or more of a memory in encoding of the EXI, thereby achieving control of memory consumption. Moreover, in the technique disclosed in Japanese Patent Application Laid-Open No. 2010-250434, it is discriminated, based on belonging information of the value of an encoding table and the upper limit value of the size of the value, whether or not to hold the value of the encoding table in an internal memory, in order to control memory consumption in a decoding process.

In the EXI Profile, since parameters are complicated, deep knowledge of the EXI is necessary to understand meanings and effects of the parameters. Consequently, it is hard for a general application developer to perform parameter settings. Moreover, since the parameters constrain encoding rules, the parameters and compression efficiency are in the relation of trade-off. Consequently, if the setting is performed badly, the compression efficiency considerably deteriorates, so that the advantages of the binary XML deteriorate.

SUMMARY OF THE INVENTION

Consequently, an object of the present invention is to provide an information processing apparatus which is characterized by comprising: a memory usage estimating unit configured to estimate a memory usage concerning holding of a correspondence table of a part of structured data and codes; and a compression effect estimating unit configured to estimate a compression effect obtained when the structured data is encoded, by holding the correspondence table, wherein a data size of the correspondence table is variable according to a value of a parameter, and the information processing apparatus further comprises a determining unit configured to, under a condition of the memory usage, determine the value of the parameter on the basis of the memory usage estimated by the memory usage estimating unit and the compression effect estimated by the compression effect estimating unit, and an encoding unit configured to encode the structured data on the basis of the value of the parameter determined by the determining unit.

Further features of the present invention will become apparent from the following description of exemplary embodiments with reference to the attached drawings.

DESCRIPTION OF THE EMBODIMENTS

Hereinafter, embodiments of the present invention will be described with reference to the attached drawings.

First Embodiment

Figure 1:
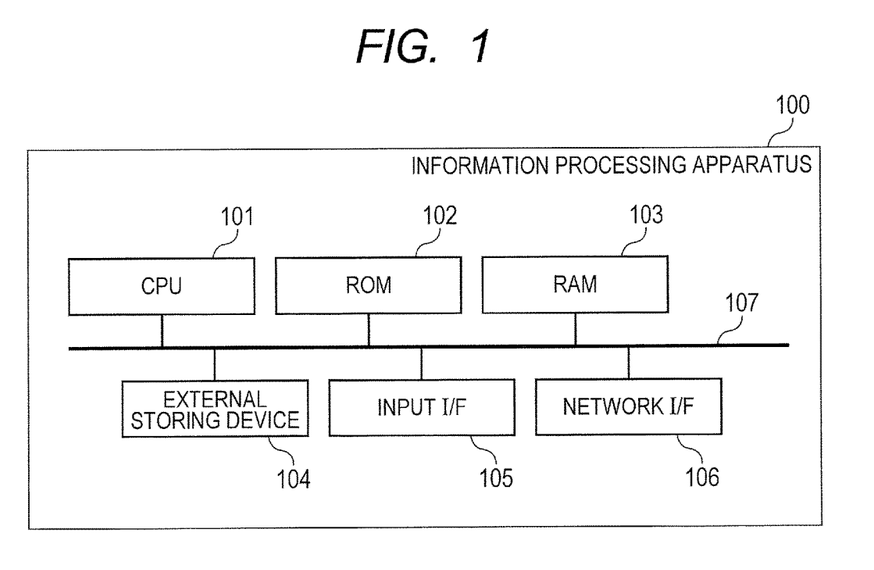
FIG. 1 is a block diagram illustrating an example of the hardware constitution of an information processing apparatus.

An information processing apparatus according to the present embodiment will be described with reference to FIG. 1. Here, it is possible to achieve the information processing apparatus not only by a single computer but also by spreading as necessary the function thereof with a plurality of computers. If the information processing apparatus is constituted by the plurality of computers, these computers are mutually connected by a LAN (local area network) or the like such that they can mutually communicate with others.

A CPU (central processing unit) 101 controls the whole of an information processing apparatus 100.

A ROM (read only memory) 102 stores therein programs and parameters for which change is unnecessary.

A RAM (random access memory) 103 temporarily stores therein programs and data which are supplied from an external device or the like.

An external storing device 104 is a storing device which is fixedly provided in the information processing apparatus 100. For example, the external storing device may include a hard disk, a memory card, an FD (flexible disk) detachably provided in the information processing apparatus 100, an optical disk such as a CD (compact disk) or the like, a magnetic card, an optical card, an IC (integrated circuit) card, and a memory card.

An input I/F (interface) 105 is an interface which interfaces with an input device such as a pointing device, a keyboard and the like.

A network I/F 106 is an interface which interfaces with a network line such as the Internet or the like.

A system bus 107 is a bus which communicably connects the respective units 101 to 106 to others.

Incidentally, later-described software configurations and flow-chart processes of the information processing apparatus 100 are achieved under the condition that the CPU 101 performs processes based on the programs stored in the ROM 102, the external storing device 104 and the like.

Subsequently, a process of automatically setting parameters to be used in the present embodiment will be described.

Figure 2:
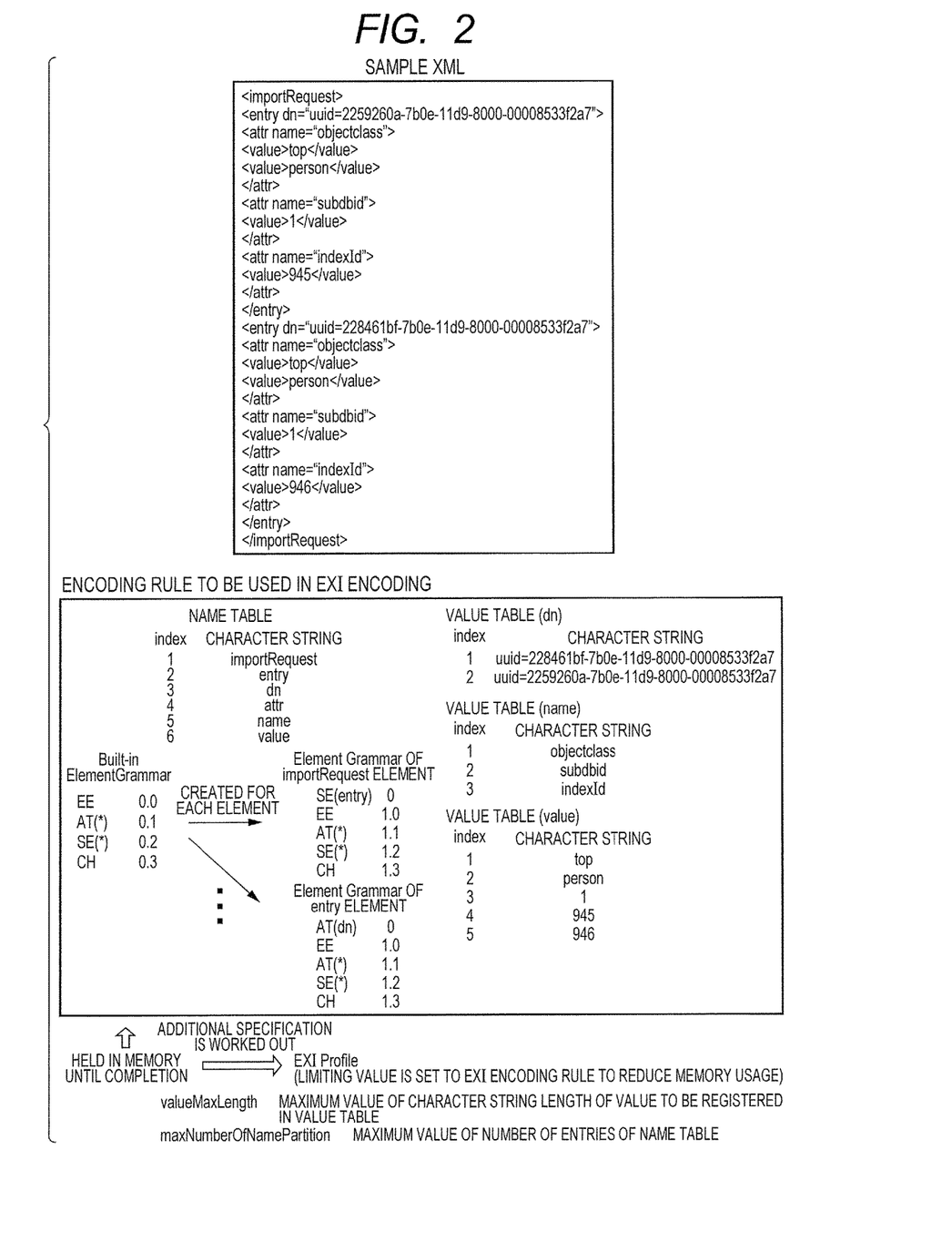
FIG. 2 is a diagram illustrating an example of an XML document to be encoded.

FIG. 2 is a diagram illustrating an example of an XML document to be encoded.

More specifically, FIG. 2 indicates a state of the internal memory in performing EXI encoding to the XML document. Here, the XML document is an example of structured data.

Hereinafter, the state of the internal memory illustrated in FIG. 2 will be described.

The EXI encoding is performed from the head of the document. Then, character strings which appear are sequentially registered to a table. At this time, the character string indicating an element name or an attribute name is registered to a name table, whereas the character string indicating a value is registered to a value table. Here, the appeared character string is an example of a part of the XML document, and the table is an example of a correspondence table.

Moreover, in the encoding, an encoding rule called Grammar is used, an end element (EE) is encoded to a code 0.0, and an attribute (AT(*)) is encoded to a code 0.1. The Grammar changes in dependence on the XML document being the encoding target. For example, if an importRequest element first appears, an Element Grammar for the importRequest element is newly created. The data in the importRequest element is encoded by the Element Grammar for the importRequest element. Further, if an entry element appears in the child element of the importRequest element, an Element Grammar for the entry element is newly created.

Then, a production (SE(entry) 0) for an entry is added to the Element Grammar for an import element.

Data of subsequent XML documents are encoded according to updated and created Grammars.

As just described, a large amount of memory is consumed in the EXI encoding.

Thus, in an EXI Profile, memory usage (i.e., a memory use amount) is controlled by parameter settings.

Incidentally, a valueMaxLength is a parameter indicating the maximum value of a character string length of a value to be registered to the value table, and a character string exceeding the relevant length is not registered to the value table. Here, the maximum value of the character string length is an example of a limiting value.

Further, a maxNumberOfNamePartition is a parameter indicating the maximum value of the number of entries of the name table. If the number of entries exceeds the relevant value, an entry is not newly added. Here, the maximum value of the number of entries is an example of the limiting value.

That is, the data of the table is variable according to the values of the parameters.

In the EXI encoding, the value table is created for each element to which the value has been described and each attribute to which the value has been described.

In the EXI Profile, if the name of the element or attribute is not entered to the name table, a value table corresponding thereto is not created. For example, if an attribute name dn is not entered to the name table due to constraint of the maxNumberOfNamePartition parameter, a value table (dn) is not created.

In the present embodiment, the valueMaxLength parameter and the maxNumberOfNamePartition parameter are automatically set.

Figure 3:
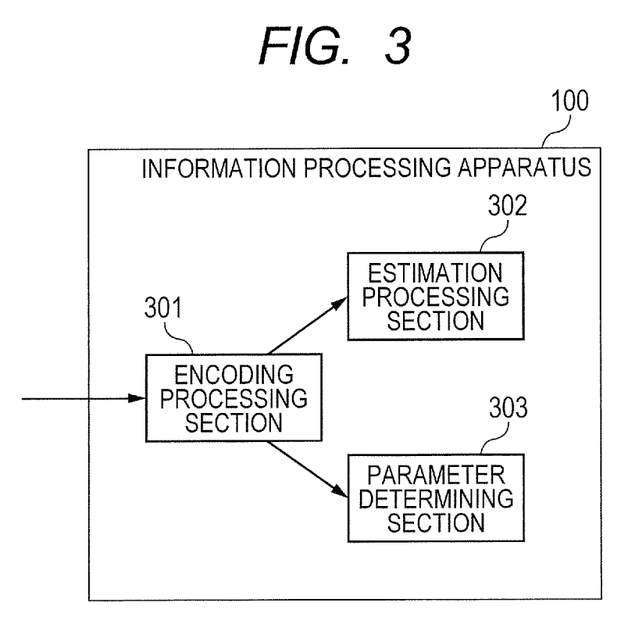
FIG. 3 is a diagram illustrating an example of a software configuration of the information processing apparatus.

FIG. 3 is a diagram illustrating an example of a software configuration of the information processing apparatus 100.

An encoding processing section 301 performs the EXI encoding to the input XML document.

An estimation processing section 302 estimates the memory usage and a compression effect (i.e., memory usage estimation and compression effect estimation). Here, the estimation processing section 302 estimates the memory usage and the compression effect for each entry of the table.

A parameter determining section 303 determines the value of the parameter by using the estimated result.

The encoding processing section 301 discriminates whether or not the memory usage is limited. If it is discriminated that the memory usage is not limited, the encoding processing section performs the normal EXI encoding. On the other hand, if it is discriminated that the memory usage is limited, the encoding processing section 301 estimates the memory usage and the compression effect by using the estimation processing section 302.

Figure 4:
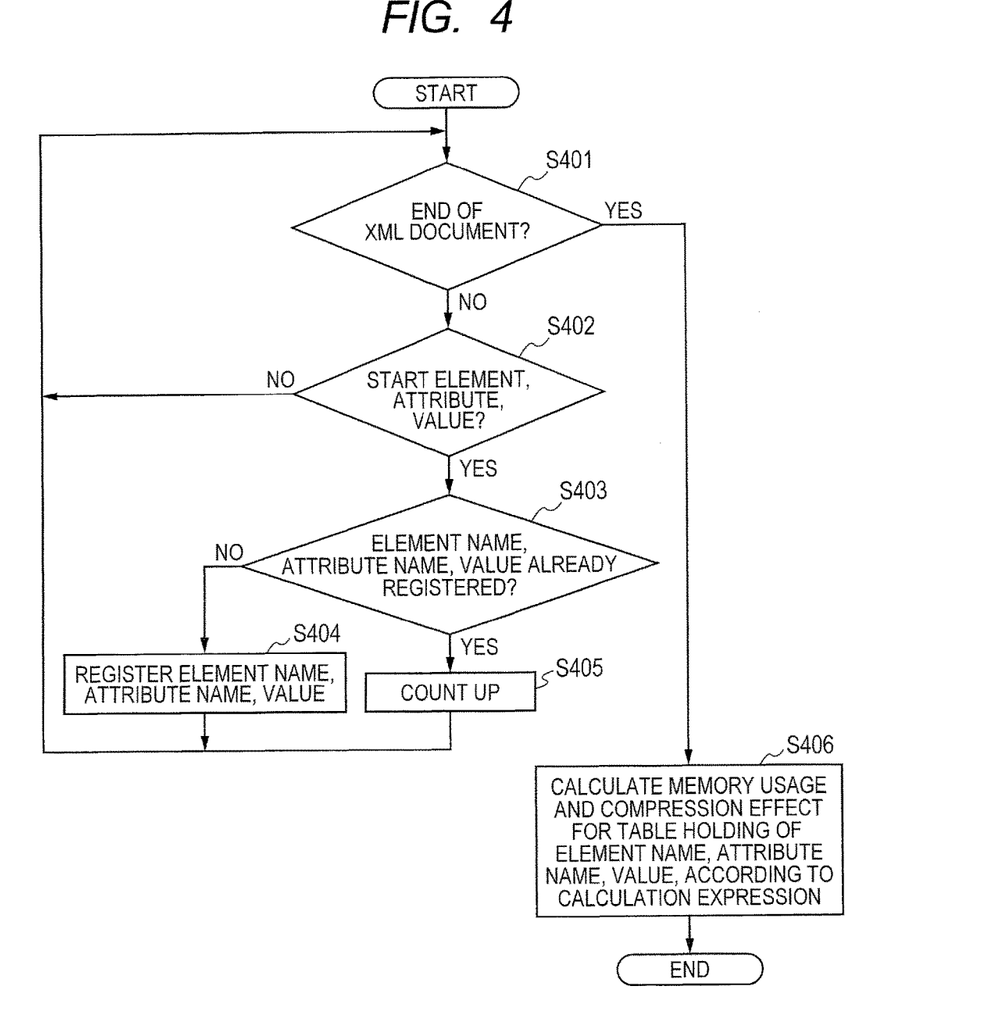
FIG. 4 is a flow chart indicating an example of an information process of estimating a memory usage and a compression effect.

FIG. 4 is a flow chart indicating an example of an information process of estimating the memory usage and the compression effect. Hereinafter, the process indicated by the flow chart will be described with reference to FIG. 4.

The estimation processing section 302 reads the XML document from the head thereof, analyzes the read document, and performs the estimation based on the analyzed result.

In S401, the estimation processing section 302 discriminates whether or not the input XML data indicates the end of the XML document. The estimation processing section 302 advances the process to S406 if it is discriminated that the input XML data indicates the end, or advances the process to S402 if it is discriminated that the input XML data does not indicate the end.

In S402, the estimation processing section 302 discriminates whether the input XML data indicates any one of a start element, an attribute and a value. The estimation processing section 302 advances the process to S403 if it is discriminated that the input XML data indicates any one of the start element, the attribute and the value, whereas the estimation processing section reads next XML data and returns the process to S401 if it is discriminated that the input XML data does not indicate any one of the start element, the attribute and the value.

In S403, the estimation processing section 302 confirms whether or not the element name, the attribute name and the value have already been registered on an estimation table.

Figure 5:
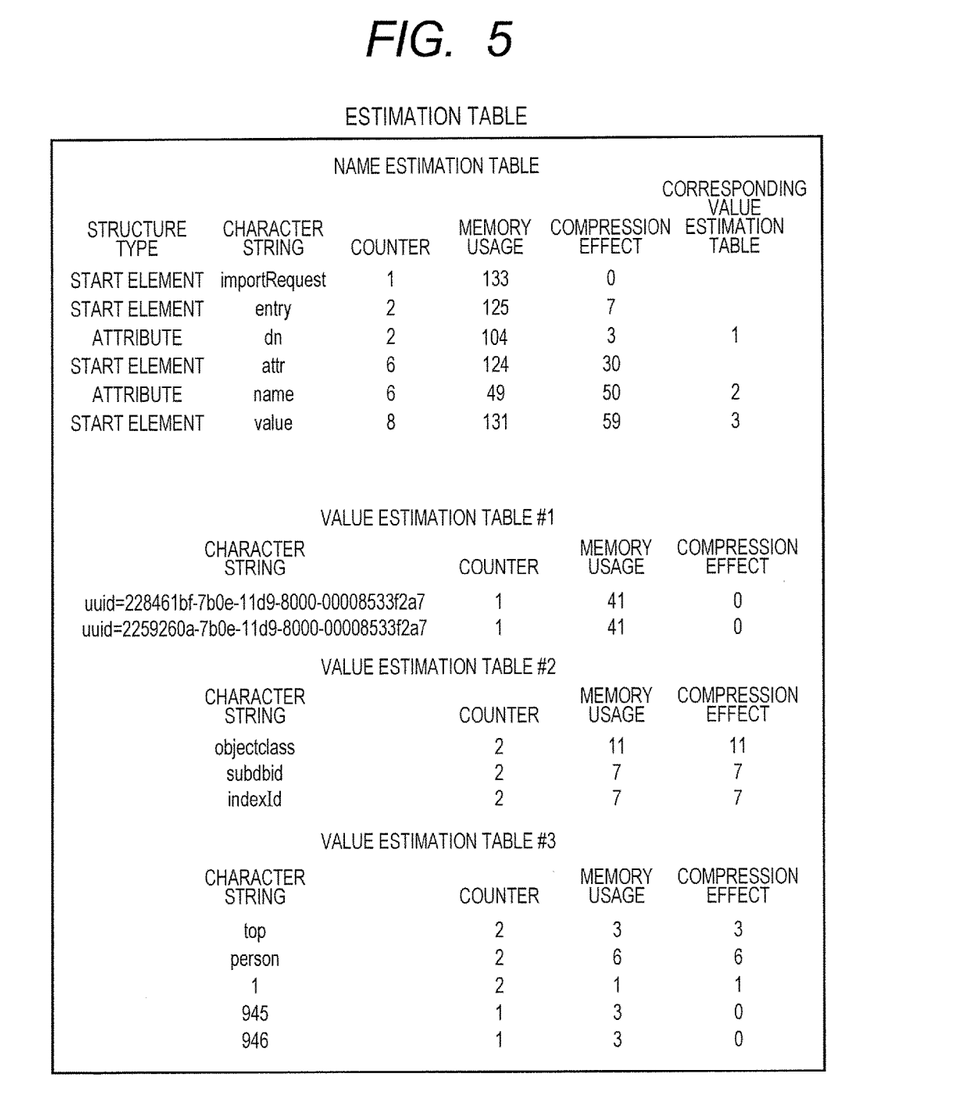
FIG. 5 is a diagram illustrating an example of an estimation table.

FIG. 5 is a diagram illustrating an example of the estimation table.

A name estimation table is used for estimating the memory usage and the compression effect in the case where the element name and the attribute name are held on the name table in the EXI encoding.

A value estimation table is used for estimating the memory usage and the compression effect in the case where the value is held on the value table in the EXI encoding.

Here, the description returns to FIG. 4.

The estimation processing section 302 advances the process to S405 if it is confirmed that the element name, the attribute name and the value have already been registered, or advances the process to S404 if it is confirmed that the element name, the attribute name and the value are not registered.

In S404, the estimation processing section 302 registers the information indicating the start element or the attribute on the name estimation table, or registers the information indicating the value on the value estimation table. Further, in the case where the information indicates the start element or the attribute, the estimation processing section 302 registers, as the information, the type of structure indicating whether the information indicates the start element or the attribute, and the name character string. Besides, the estimation processing section 302 sets "1" to a counter as the initial value. On the other hand, in the case where the information indicates the value, the estimation processing section 302 registers the value character string as the information. Besides, the estimation processing section 302 sets "1" to the counter as the initial value.

The value estimation table is created for each of the element and the attribute to which the value has been described. If the corresponding value estimation table does not exist, the estimation processing section 302 newly creates a value estimation table, and records a link to the created value estimation table to the entries of the corresponding element and attribute of the name estimation table.

The estimation processing section 302 reads next XML data and returns the process to S401.

On the other hand, in S405, the estimation processing section 302 increase the counter of the entry of the corresponding estimation table by "1". Then, the estimation processing section 302 reads next XML data and returns the process to S401.

Figure 6:
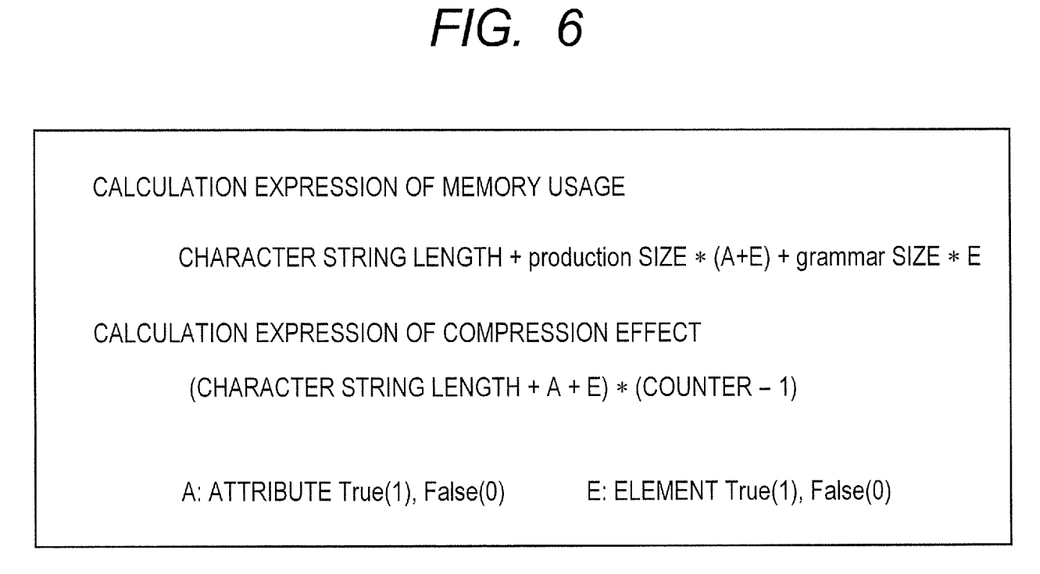
FIG. 6 is a diagram illustrating an example of calculation expressions for performing estimating calculations for the memory usage and the compression effect.

If it is discriminated in S401 that the input XML data indicates the end of the XML document, the estimation processing section advances the process to S406 to estimate the memory usage and the compression effect according to calculation expressions shown in FIG. 6.

FIG. 6 is the diagram illustrating an example of the calculation expressions for performing the estimating calculations of the memory usage and the compression effect.

In this figure, "A" indicates whether or not the entry is the attribute. If the entry is the attribute, the "A" is 1 (True). On the other hand, if the entry is not the attribute, the "A" is 0 (False).

"E" indicates whether or not the entry is the element. If the entry is the element, the "E" is 1 (True). On the other hand, if the entry is not the element, the "E" is 0 (False).

"CHARACTER STRING LENGTH" indicates the length of the character string registered in each entry.

"COUNTER" indicates the value of the counter registered in each entry.

"production SIZE" indicates the estimation value of the memory size for one entry of the production used in the EXI encoding.

"grammar SIZE" indicates the estimation value of the memory size for one table of the grammar used in the EXI encoding.

In the present embodiment, the memory usage and the compression effect which are estimated by the calculation expressions in FIG. 6 are as shown in FIG. 5. In the memory usage and the compression effect of the name estimation table, the memory usage and the compression effect of the value estimation table of the link destination are added.

After the estimation by the estimation processing section 302 ended, the encoding processing section 301 determines the values of the valueMaxLength parameter and the maxNumberOfNamePartition parameter by using the parameter determining section 303.

Figure 7:
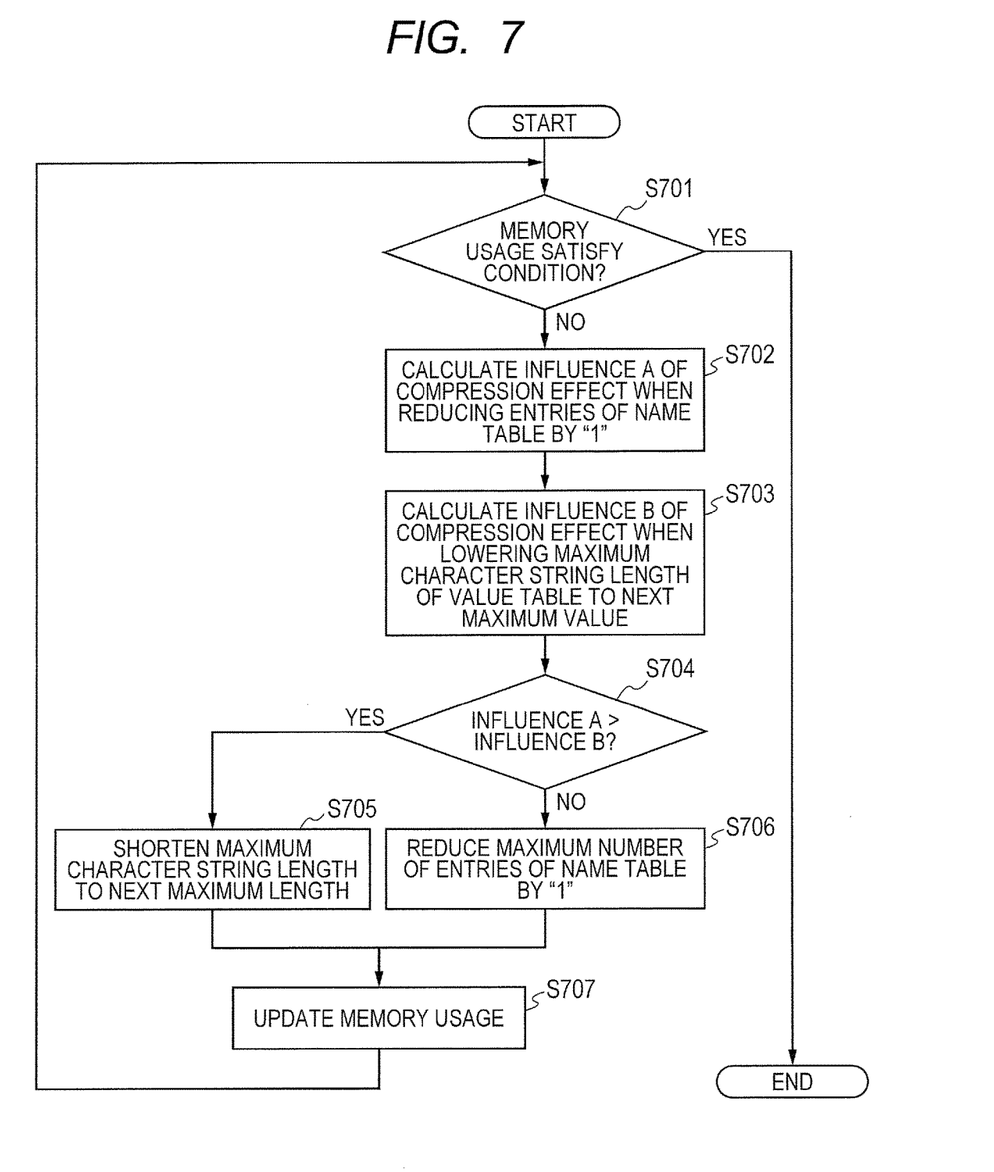
FIG. 7 is a flow chart indicating an example of an information process of determining parameters.

FIG. 7 is a flow chart indicating an example of an information process of determining the parameters.

Hereinafter, the process indicated by the flow chart will be described with reference to FIG. 7.

The parameter determining section 303 sets the maximum length of the character string registered on the value estimation table and the number of entries of the name estimation table, respectively as the initial values of the valueMaxLength parameter and the maxNumberOfNamePartition parameter.

In S701, the parameter determining section 303 discriminates whether or not the estimated memory usage satisfies a certain condition. If it is discriminated that the estimated memory usage satisfies the condition, the parameter determining section 303 ends the process of FIG. 7 and determines the valueMaxLength parameter and the maxNumberOfNamePartition parameter at the present moment as the parameter values. On the other hand, if it is discriminated that the estimated memory usage does not satisfy the condition, the parameter determining section 303 advances the process to S702.

In S702, the parameter determining section 303 calculates the compression effect of the last entry of the name estimation table as an influence A.

In S703, the parameter determining section 303 calculates the compression effect of the maximum-length character string of the value estimation table as an influence B.

In S704, the parameter determining section 303 discriminates whether or not the influence A is larger than the influence B. The parameter determining section 303 advances the process to S705 if it is discriminated that the influence A is larger, and advances the process to S706 if it is discriminated that the influence A is not larger.

In S705, the parameter determining section 303 deletes the maximum-length character string from the value estimation table. Further, the parameter determining section 303 reduces the memory usage and the compression effect corresponding to the deleted character string in regard to the entry of the name estimation table to which the link to the value estimation table in which the character string has been deleted is posted.

In S707, the parameter determining section 303 reduces the memory usage corresponding to the deleted character string. Further, the parameter determining section 303 sets the valueMaxLength parameter and the maxNumberOfNamePartition parameter respectively to the maximum length of the character string registered on the value estimation table and the number of entries on the name estimation table, and returns the process to S701.

On another front, in S706, the parameter determining section 303 deletes the last entry from the name estimation table. Further, the parameter determining section 303 also deletes the value estimation table linked from the deleted entry. Then, the parameter determining section 303 advances the process to S707.

Figure 8:
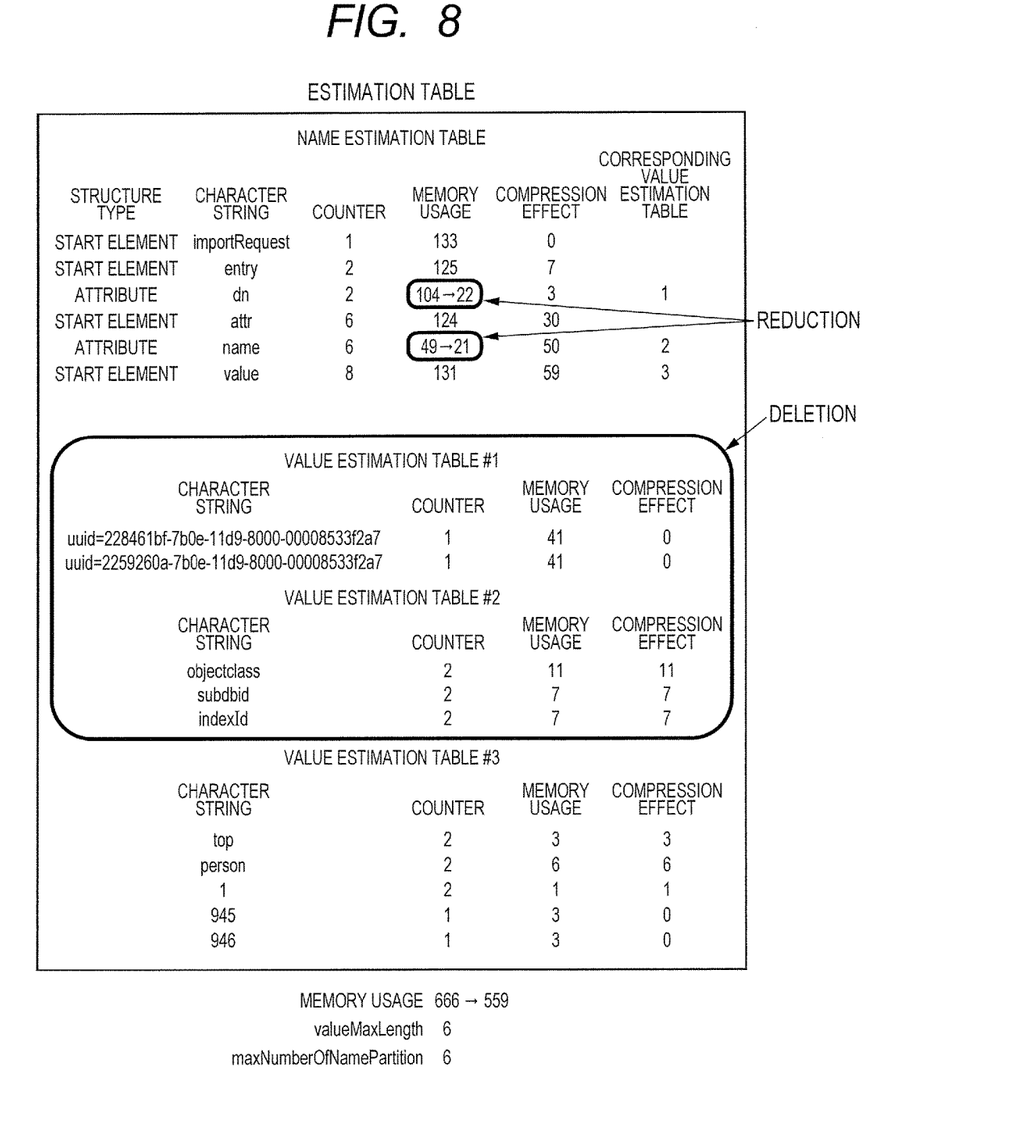
FIG. 8 is a diagram illustrating an example of the estimation table in a case where a condition that the memory usage is equal to or smaller than 560 is set.

In the present embodiment, in a case where a condition that the memory usage is equal to or smaller than 560 is set, as illustrated in FIG. 8, the value estimation table #1 and the value estimation table #2 are deleted, and the memory usage is reduced from 666 to 559. Further, the valueMaxLength parameter is determined as 6, and the maxNumberOfNamePartition parameter is determined as 6.

For example, the CPU 101 sets the condition of the memory usage according to user operations through the screen or the like or according to settings of a setting file or the like. Likewise, a condition of a later-described memory reduction, a threshold of the compression effect and the like are set in the same manner.

Second Embodiment

In the present embodiment, a method of individually designating entries to be held on the name table and the value table in the EXI encoding will be described.

In such individual designation, the parameter determining section 303 sets the valueMaxLength parameter to 0, and also sets the maxNumberOfNamePartition parameter to 0.

As well as the first embodiment, the encoding processing section 301 estimates the memory usage and the compression effect by using the estimation processing section 302.

Further, the encoding processing section 301 determines the entries to be held on the name table and the value table in the EXI encoding, by using the parameter determining section 303.

Figure 9:
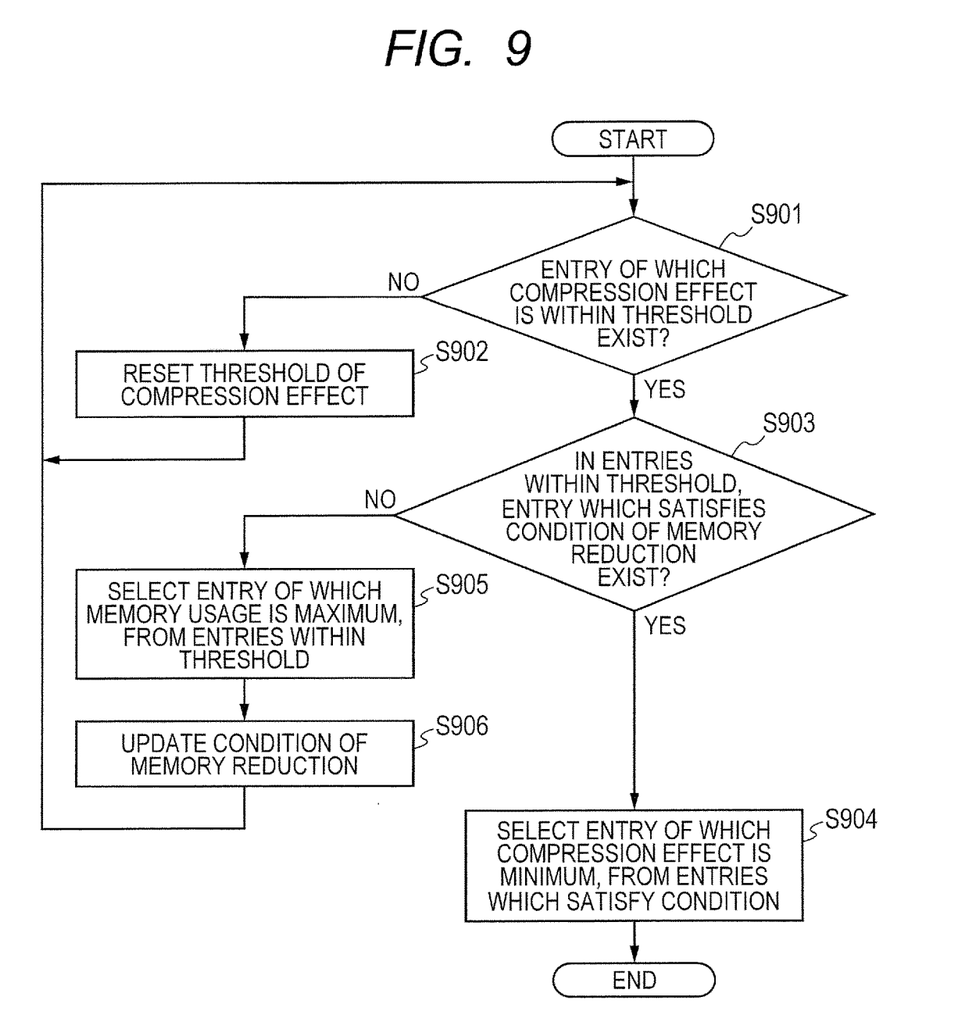
FIG. 9 is a flow chart indicating an example of an information process of determining an entry to be held.

FIG. 9 is a flow chart indicating an example of an information process of determining the entry to be held.

Hereinafter, the process indicated by the flow chart will be described with reference to FIG. 9.

In S901, the parameter determining section 303 discriminates whether or not the entry of which the compression effect is within a threshold exists. Then, the parameter determining section 303 advances the process to S903 if it is discriminated that the relevant entry exists, and advances the process to S902 if it is discriminated that the relevant entry does not exist.

In S902, the parameter determining section 303 changes the threshold of the compression effect for creating an entry within the threshold, and returns the process to S901.

In S903, the parameter determining section 303 discriminates whether or not, in the entries within the threshold, the entry which satisfies the condition of the memory reduction for satisfying a limit of the memory usage exists. The parameter determining section 303 advances the process to S904 if it is discriminated that the entry satisfying the condition exists, and advances the process to S905 if it is discriminated that the entry satisfying the condition does not exist.

In S904, the parameter determining section 303 selects, from the entries which satisfy the condition, the entry of which the compression effect is minimum. Then, since the limit of the memory usage is satisfied, the parameter determining section 303 ends the process of FIG. 9.

On another front, in S905, the parameter determining section 303 selects, from the entries within the threshold, the entry of which the memory usage is maximum, and deletes the selected entry from the estimation table. Here, if the deleted entry is the entry of the value estimation table, the parameter determining section 303 reduces the memory usage and the compression effect corresponding to the deleted entry in regard to the entry of the name estimation table to which the link to the value estimation table in which the entry has been deleted is posted. On another front, if the deleted entry is the entry of the name estimation table, the parameter determining section 303 also deletes the value estimation table linked from the deleted entry.

In S906, the parameter determining section 303 updates the condition of the memory reduction from the memory usage corresponding to the deletion, and returns the process to S901. At this time, the parameter determining section 303 may return the process to S901 after resetting the threshold of the compression effect.

Figure 10:
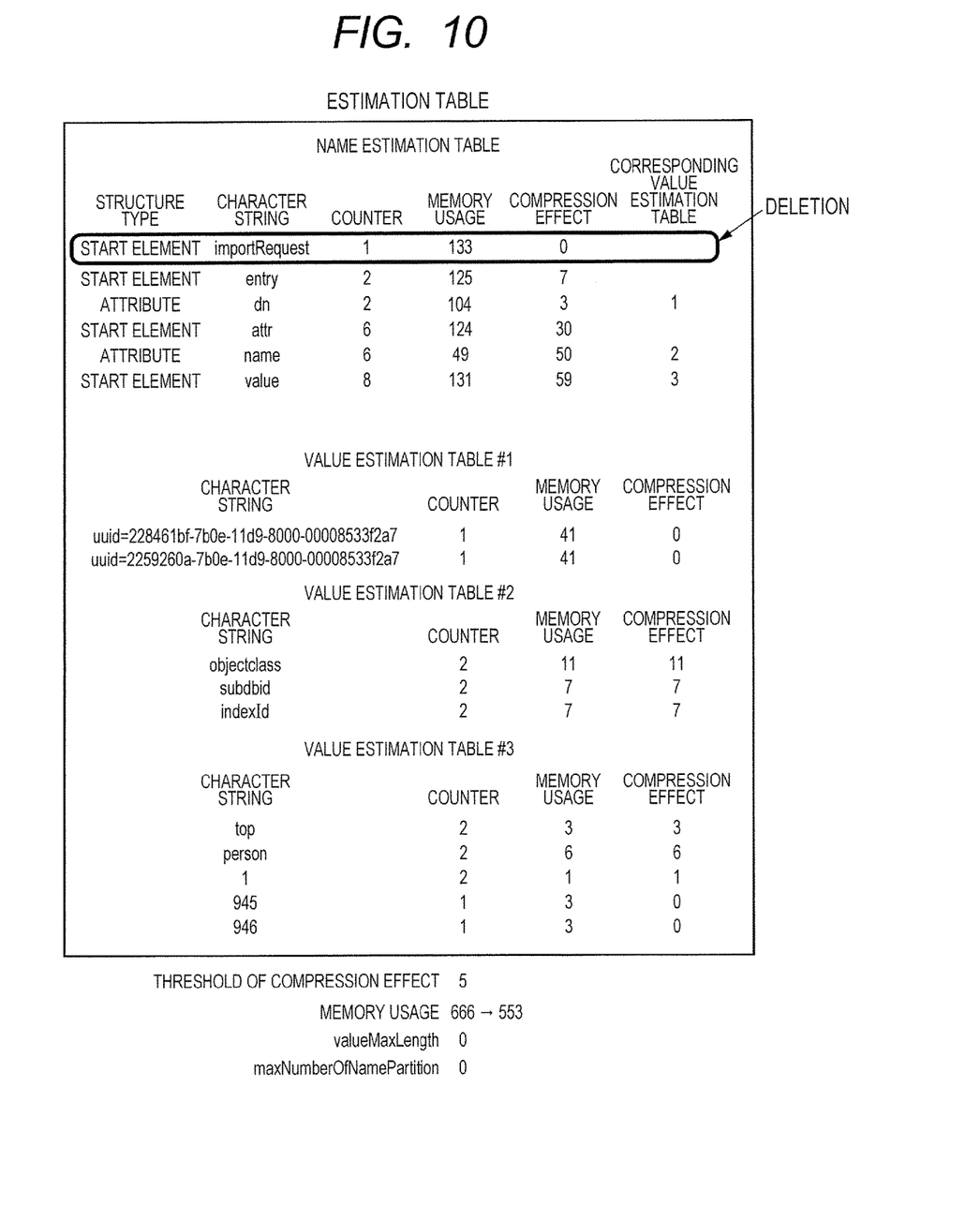
FIG. 10 is a diagram illustrating an example of the estimation table in a case where a condition that the threshold of the compression effect is 5 and the memory usage is equal to or smaller than 560 is set.

In the present embodiment, in a case where a condition that the threshold of the compression effect is 5 and the memory usage is equal to or smaller than 560 is set, as illustrated in FIG. 10, the entry of the importRequest element is deleted from the name estimation table, and the memory usage is reduced from 666 to 533.

Further, the valueMaxLength parameter is determined as 0, and the maxNumberOfNamePartition parameter is determined as 0. Then, the corresponding element, attribute and value are subjected to schema definition such that the remaining entries of the estimation table are held on the name table and the value table in the EXI encoding.

Further, the parameter determining section 303 may determine the valueMaxLength parameter as 41 and perform the schema definition only to the corresponding element and attribute.

Furthermore, the parameter determining section 303 may perform, instead of the schema definition, definition on an original preset basis of a device of performing EXI encoding and decoding.

Figure 11:
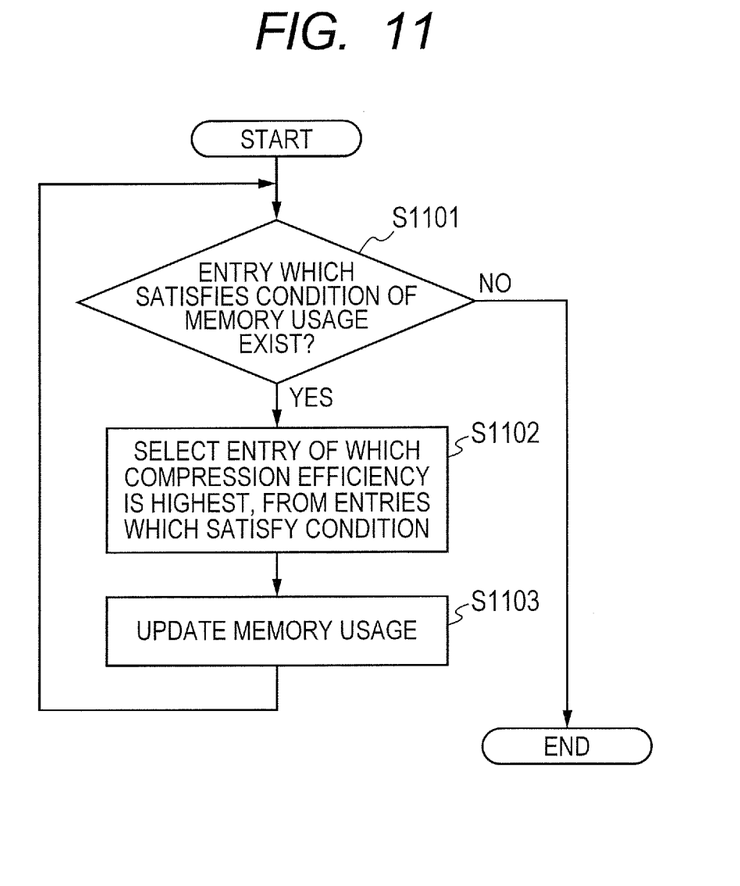
FIG. 11 is a flow chart indicating an example of an information process of determining an entry to be held in a case where a determining time is shortened.

In the present embodiment, since it is necessary to set the threshold of the compression effect, there is a case where it takes time to determine the entries to be held on the name table and the value table in the EXI encoding. Therefore, it may be possible to provide a plurality of modes as the entry determining method. More specifically, the parameter determining section 303 selects the procedure as indicated in FIG. 9 under normal conditions, but selects a procedure as indicated in FIG. 11 if it is necessary to shorten a determining time. Here, it may be possible to switch the mode according to settings of the setting file or the like or to automatically switch the mode if it is judged that the determining time will be longer than the set time.

Hereinafter, a flow chart process in the case where the determining time is shortened will be described based on the information process of indicated in FIG. 11.

In S1101, the parameter determining section 303 discriminates whether or not the entry which satisfies the condition of the memory usage exists on the estimation table. If it is discriminated that the relevant entry does not exist, the parameter determining section 303 ends the process of FIG. 11 because it is impossible to hold the entries on the name table and the value table in the EXI encoding even more than the current time. On the other hand, if it is discriminated that the relevant entry exists, the parameter determining section 303 advances the process to S1102.

In S1102, the parameter determining section 303 selects, in the entries which satisfy the condition, the entries of which the compression effects are high as the entries to be held on the name table and the value table in the EXI encoding.

In S1103, the parameter determining section 303 updates the condition of the memory usage based on the memory usage of the selected entry, and returns the process to S1101.

Thus, since it is unnecessary to redetermine the threshold setting, it is possible to perform the parameter determining faster than the process of FIG. 9.

As just described, according to the above embodiments, it is possible to automatically determine the encoding parameters and perform the encoding using the determined parameters in consideration of the compression effect and the condition of the memory usage.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-254338, filed Dec. 9, 2013, which is hereby incorporated by reference wherein in its entirety.

What is claimed is:

1. An information processing apparatus comprising:
one or more hardware processors; and
a memory which stores instructions to be executed by the one or more hardware processors, wherein in accordance with the instructions executed by the one or more hardware processors, the information processing apparatus performs:
(1) obtaining structured data comprising character strings to be subjected to encoding;
(2) determining at least one of (a) a first parameter for limiting a length of a character string of the structured data to be subjected to encoding and (b) a second parameter for limiting a number of attributes of character strings of the structured data to be subjected to encoding, so that a data size of information indicating correspondence between character strings of the structured data to be subjected to encoding and codes for encoding the character strings of the structured data to be subjected to encoding is less than a predetermined size;
(3) storing information indicating correspondence between the character strings of the structured data to be subjected to encoding and the codes for encoding the character strings of the structured data to be subjected to encoding, wherein the information is generated according to at least one of the first parameter and the second parameter;
(4) encoding the character strings of the structured data to be subjected to encoding using the information indicating correspondence between the character strings of the structured data to be subjected to encoding and the codes for encoding the character strings of the structured data to be subjected to encoding, wherein the information indicating correspondence between the character strings of the structured data to be subjected to encoding and the codes for encoding the character strings of the structured data to be subjected to encoding comprises a correspondence table;
(5) analyzing the obtained structured data; and
(6) estimating a data size of each entry of the correspondence table or estimating a compression effect for each entry of the correspondence table, wherein at least one of the first parameter and the second parameter is determined based on a result of the estimating.

2. The information processing apparatus according to claim 1,
wherein in the determining, under a condition of a memory usage, a process of (a) selecting, among entries of the correspondence table, the entry of which an estimated compression effect is highest as the entry to be held on the correspondence table, and (b) updating the condition of the memory usage on the basis of an estimated data size of the selected entry is repeated until the entry which satisfies the condition of the memory usage disappears.

3. The information processing apparatus according to claim 1,
wherein in the determining, on the basis of (i) a threshold of a compression effect, (ii) an estimated memory usage, and (iii) an estimated compression effect in a case where there is no entry of which the compression effect is within the threshold and the memory usage satisfies a condition of a memory reduction, a process of (a) selecting the entry of which the compression effect is within the threshold and the memory usage is highest as the entry to be not held on the correspondence table, (b) deleting the selected entry, and (c) updating the condition of the memory reduction on the basis of the memory usage of the deleted entry is repeated until the entry of which the compression effect is within the threshold and which satisfies the condition of the memory reduction appears.

4. The information processing apparatus according to claim 1, wherein the parameter determined in the determining indicates a maximum length of a character string to be subjected to encoding.

5. The information processing apparatus according to claim 1, wherein the parameter determined in the determining indicates a maximum number of entries for elements and attributes of character strings to be subjected to encoding.

6. The information processing apparatus according to claim 1, wherein the structured data includes XML (Extensible Markup Language) data, and
wherein in the encoding, the structured data is encoded into EXI (Efficient XML Interchange) data.

7. The information processing apparatus according to claim 1, wherein in the determining, both the first parameter and the second parameter are determined.

8. The information processing apparatus according to claim 1, wherein the information processing apparatus further performs:
detecting a length of each of a plurality of character strings included in the obtained structured data; and detecting a number of times of appearance for each of the plurality of character strings in the obtained structured data,
wherein in the determining, at least one of the first parameter and the second parameter are determined based on (i) the detected length and (ii) the detected number of times of appearance.

9. The information processing apparatus according to claim 1, wherein in the estimating, the data size of an entry is estimated based on both a length of a character string corresponding to the entry and whether the entry corresponds to an attribute or an element.

10. The information processing apparatus according to claim 1, wherein in the estimating, the compression effect for an entry is estimated based on (1) a length of a character string corresponding to the entry, (2) a number of times of appearance of the character string in the obtained structured data, and (3) whether the entry corresponds to an attribute or an element.

11. The information processing apparatus according to claim 1, wherein the predetermined size is set according to at least one of a user operation and a setting file.

12. An information processing method to be performed by an information processing apparatus, the information processing method comprising:
   obtaining structured data comprising character strings to be subjected to encoding;
   determining at least one of (a) a first parameter for limiting a length of a character string of the structured data to be subjected to encoding and (b) a second parameter for limiting a number of attributes of character strings of the structured data to be subjected to encoding, so that a data size of information indicating correspondence between character strings of the structured data to be subjected to encoding and codes for encoding the character strings of the structured data to be subjected to encoding is less than a predetermined size;
   storing the information indicating correspondence between the character strings of the structured data to be subjected to encoding and the codes for encoding the character strings of the structured data to be subjected to encoding, wherein the information is generated according to at least one of the first parameter and the second parameter;
   encoding the character strings of the structured data to be subjected to encoding using the information indicating correspondence between the character strings of the structured data to be subjected to encoding and the codes for encoding the character strings of the structured data to be subjected to encoding, wherein the information indicating correspondence between the character strings of the structured data to be subjected to encoding and the codes for encoding the character strings of the structured data to be subjected to encoding comprises a correspondence table;
   analyzing the obtained structured data; and
   estimating a data size of each entry of the correspondence table or estimating a compression effect for each entry of the correspondence table, wherein at least one of the first parameter and the second parameter is determined based on a result of the estimating.

13. A non-transitory computer-readable storage medium storing a computer-executable program to achieve an information processing method by an information processing apparatus, the program causing a computer to perform a method comprising:
   obtaining structured data comprising character strings to be subjected to encoding;
   determining at least one of (a) a first parameter for limiting a length of a character string of the structured data to be subjected to encoding and (b) a second parameter for limiting a number of attributes of character strings of the structured data to be subjected to encoding, so that a data size of information indicating correspondence between character strings of the structured data to be subjected to encoding and codes for encoding the character strings of the structured data to be subjected to encoding is less than a predetermined size;
   storing the information indicating correspondence between the character strings of the structured data to be subjected to encoding and the codes for encoding the character strings of the structured data to be subjected to encoding, wherein the information is generated according to at least one of the first parameter and the second parameter;
   encoding the character strings of the structured data to be subjected to encoding using the information indicating correspondence between the character strings of the structured data to be subjected to encoding and the codes for encoding the character strings of the structured data to be subjected to encoding, wherein the information indicating correspondence between the character strings of the structured data to be subjected to encoding and the codes for encoding the character strings of the structured data to be subjected to encoding comprises a correspondence table;
   analyzing the obtained structured data; and
   estimating a data size of each entry of the correspondence table or estimating a compression effect for each entry of the correspondence table, wherein at least one of the first parameter and the second parameter is determined based on a result of the estimating.

* * * * *